US012812792B2

(12) United States Patent
Sakamaki et al.

(10) Patent No.: US 12,812,792 B2
(45) Date of Patent: Nov. 24, 2026

(54) BONDED BODY AND INSULATING CIRCUIT BOARD

(71) Applicant: MITSUBISHI MATERIALS CORPORATION, Tokyo (JP)

(72) Inventors: Marina Sakamaki, Saitama (JP); Kenji Kubota, Naka-gun (JP); Toyo Ohashi, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 226 days.

(21) Appl. No.: 18/904,432

(22) Filed: Oct. 2, 2024

(65) Prior Publication Data

US 2025/0024610 A1 Jan. 16, 2025

Related U.S. Application Data

(63) Continuation of application No. 17/915,129, filed as application No. PCT/JP2021/013405 on Mar. 29, 2021, now Pat. No. 12,137,526.

(30) Foreign Application Priority Data

Mar. 30, 2020 (JP) ................................ 2020-060041
Sep. 25, 2020 (JP) ................................ 2020-161017

(51) Int. Cl.
*H05K 1/02* (2006.01)
*H05K 3/38* (2006.01)

(52) U.S. Cl.
CPC ............ *H05K 3/38* (2013.01); *H05K 1/0284* (2013.01); *H05K 2203/06* (2013.01)

(58) Field of Classification Search
CPC ..... H05K 1/0284; H05K 3/38; H05K 2203/06
See application file for complete search history.

(56) References Cited

U.S. PATENT DOCUMENTS

2018/0288884 A1 10/2018 Ori et al.
2020/0029444 A1 1/2020 Uno et al.

FOREIGN PATENT DOCUMENTS

CN 101687390 A 3/2010
JP H05-029740 A 2/1993
(Continued)

OTHER PUBLICATIONS

Notice of Allowance mailed Nov. 27, 2024, issued for CN202180025520.6 and English translation thereof.
(Continued)

*Primary Examiner* — Jeremy C Norris
(74) *Attorney, Agent, or Firm* — Troutman Pepper Locke LLP

(57) ABSTRACT

A bonded body has a structure in which an insulating resin member made of an insulating resin and a metal part made of a metal are bonded. In the bonded body, a bonded interface between the insulating resin member and the metal part has an uneven shape including a protrusion in which the metal part protrudes toward an insulating resin member side and a recess in which the metal part retracts from the insulating resin member side, at least one of a kurtosis Rku of contour curve at the bonded interface of the metal part and a kurtosis Sku of contour surface at the bonded interface of the metal part is in a range of 2.75 or more and 6.00 or less, and an overhang rate that indicates a length ratio of regions overlapping in a lamination direction in a direction along the bonded interface is 7% or more.

3 Claims, 5 Drawing Sheets

(56) References Cited

FOREIGN PATENT DOCUMENTS

| | | | |
|---|---|---|---|
| JP | 2000-077850 | A | 3/2000 |
| JP | 2001-044627 | A | 2/2001 |
| JP | 2011-009267 | A | 1/2011 |
| JP | 2014-201777 | A | 10/2014 |
| JP | 2015-207666 | A | 11/2015 |
| JP | 2018-172785 | A | 11/2018 |
| WO | 2013/008651 | A1 | 1/2013 |
| WO | 2013/047056 | A1 | 4/2013 |
| WO | 2014/042201 | A1 | 3/2014 |
| WO | 2014/081041 | A1 | 5/2014 |

OTHER PUBLICATIONS

European Search Report mailed Apr. 22, 2025, issued for EP24222878.1.

International Search Report mailed Jun. 15, 2021, issued for PCT/JP2021/013405 and English translation thereof.

Supplementary European Search Report mailed Mar. 12, 2024, issued for European Patent Application No. 21779171.4.

(a)

(b)

BONDED BODY AND INSULATING CIRCUIT BOARD

TECHNICAL FIELD

The present invention relates to a bonded body having a structure in which an insulating resin member made of an insulating resin and a metal part are bonded, and an insulating circuit board.

Priority is claimed on Japanese Patent Application No. 2020-060041, filed Mar. 30, 2020, and Japanese Patent Application No. 2020-161017, filed Sep. 25, 2020, the contents of which are incorporated herein by reference.

BACKGROUND ART

Each of a power module, LED module, and thermoelectric module has a structure in which a power semiconductor element, an LED element, and a thermoelectric element are bonded to an insulating circuit board in which a circuit layer made of a conductive material is formed on one surface of an insulating layer. As the insulating layer, an insulating layer made of ceramics or an insulating resin has been proposed.

Here, as an insulating circuit board provided with an insulating resin layer, for example, a metal-based circuit board is proposed in Patent Document 1. In addition, a multilayer wiring board is proposed in Patent Document 2.

In the metal-based circuit board described in Patent Document 1, an insulating resin layer is formed on a metal substrate, and a circuit layer having a circuit pattern is formed on this insulating resin layer. Here, the insulating resin layer is made of an epoxy resin that is a thermosetting resin, and the circuit layer is made of a copper foil.

This metal-based circuit board has a structure in which a semiconductor element is bonded onto the circuit layer, a heat sink is arranged on a surface of the metal substrate opposite to the insulating resin layer, and heat generated by the semiconductor element is transferred to the heat sink side to dissipate heat.

In addition, the multilayer wiring board described in Patent Document 2 is manufactured in such a manner that a surface roughness (Ra) of a metal foil is set to 0.2 μm or more, etching treatment is carried out on the metal foil adhered to a resin film, the etching treatment is further carried out on the metal foil to have a circuit pattern shape, thereby forming a wiring circuit layer, the wiring circuit layer formed on the surface of the resin film is embedded while applying pressure to a surface of a soft insulating sheet, an insulating circuit layer is transferred to the surface of the insulating sheet to obtain a plurality of insulating sheets, and the plurality of insulating sheets thus obtained are laminated and heat-cured all at once.

CITATION LIST

Patent Documents

Patent Document 1

Japanese Unexamined Patent Application, First Publication No. 2015-207666

Patent Document 2

Japanese Unexamined Patent Application, First Publication No. 2000-077850

SUMMARY OF INVENTION

Technical Problem

In an insulating circuit board having a structure in which a metal plate or the like is bonded to an insulating resin layer to form a circuit layer, it is important to ensure the adhesion between the insulating resin layer and the circuit layer (metal plate) so that peeling of the circuit layer (metal plate) from the insulating resin layer does not occur during use.

Here, in the metal-based circuit board described in Patent Document 1, it was not considered to improve the adhesion between the insulating resin layer and the circuit layer, so that a risk for the occurrence of peeling of the circuit layer (metal plate) from the insulating resin layer during use has existed.

On the other hand, in the multilayer wiring board described in Patent Document 2, the object was to improve the adhesion between the insulating sheet and the wiring circuit layer by embedding the wiring circuit layer in the insulating sheet with the surface roughness (Ra) set to 0.2 μm or more.

However, in a case where the surface roughness (Ra) of the metal plate (wiring circuit layer) is too large, electric charges are concentrated on a portion into which the metal plate surface intrudes, resulting in reduction in insulation properties (insulating withstand voltage) of the insulating resin layer. Therefore, there was a risk that the multilayer wiring board could not be used as an insulating circuit board.

The present invention has been made in view of the above-mentioned circumstances, and an objective of the present invention is to provide a bonded body that has excellent adhesion between an insulating resin member and a metal part, has excellent insulation properties in the insulating resin member and can be stably used, and an insulating circuit board.

Solution to Problem

In order to solve the above-mentioned problems, a bonded body of the present invention has a structure in which an insulating resin member made of an insulating resin and a metal part made of a metal are bonded, and in the bonded body, a bonded interface between the insulating resin member and the metal part has an uneven shape including a protrusion in which the metal part protrudes toward an insulating resin member side and a recess in which the metal part retracts from the insulating resin member side, at least one of a kurtosis Rku of contour curve at the bonded interface of the metal part and a kurtosis Sku of contour surface at the bonded interface of the metal part is in a range of 2.75 or more and 6.00 or less, and an overhang rate that indicates a length ratio of regions overlapping in a lamination direction in a direction along the bonded interface is 7% or more.

According to the bonded body having this configuration, since the bonded interface between the insulating resin member and the metal part has an uneven shape including a protrusion in which the metal part protrudes toward an insulating resin member side and a recess in which the metal part retracts from the insulating resin member side, and at least one of a kurtosis Rku of contour curve at the bonded interface of the metal part and a kurtosis Sku of contour surface at the bonded interface of the metal part is in a range of 2.75 or more and 6.00 or less, a tip of the protrusion is not sharpened more than necessary, and the insulation properties (insulating withstand voltage) of the insulating resin member can be sufficiently ensured.

Furthermore, since the overhang rate indicating the length ratio of regions overlapping in a lamination direction in a direction along the bonded interface is 7% or more, the metal part and the insulating resin member are sufficiently engaged, and the adhesion between the insulating resin member and the metal part can be improved.

Here, in the bonded body of the present invention, at least one of the root mean square deviation Rq of contour curve at the bonded interface of the metal part and the root mean square deviation Sq of contour surface at the bonded interface of the metal part is preferably in a range of 0.20 μm or more and 0.90 μm or less.

In this case, since at least one of the root mean square deviation Rq of contour curve at the bonded interface of the metal part and the root mean square deviation Sq of contour surface at the bonded interface of the metal part is in a range of 0.20 μm or more and 0.90 μm or less, it is possible to suppress the generation of electric field concentration at the tip of the protrusion, surely ensure the insulation properties, and improve the adhesion between the insulating resin member and the metal part.

An insulating circuit board of the present invention includes an insulating resin layer, and a circuit layer in which a metal plate is bonded to one surface of the insulating resin layer, and in the insulating circuit board, a bonded interface between the insulating resin layer and the circuit layer has an uneven shape including a protrusion in which the circuit layer protrudes toward an insulating resin layer side and a recess in which the circuit layer retracts from the insulating resin layer side, at least one of a kurtosis Rku of contour curve at the bonded interface of the circuit layer and a kurtosis Sku of contour surface at the bonded interface of the circuit layer is in a range of 2.75 or more and 6.00 or less, and an overhang rate that indicates a length ratio of regions overlapping in a lamination direction in a direction along the bonded interface is 7% or more.

According to the insulating circuit board having this configuration, since the bonded interface between the insulating resin layer and the circuit layer has an uneven shape including a protrusion in which the circuit layer protrudes toward an insulating resin layer side and a recess in which the circuit layer retracts from the insulating resin layer side, and at least one of a kurtosis Rku of contour curve at the bonded interface of the circuit layer and a kurtosis Sku of contour surface at the bonded interface of the circuit layer is in a range of 2.75 or more and 6.00 or less, the tip of the protrusion is not sharpened more than necessary, and the insulation properties (insulating withstand voltage) of the insulating resin portion layer can be sufficiently ensured.

Furthermore, since the overhang rate indicating the length ratio of regions overlapping in a lamination direction in a direction along the bonded interface is 7% or more, the circuit layer and the insulating resin layer are sufficiently engaged, and the adhesion between the circuit layer and the insulating resin layer can be improved.

Here, in the insulating circuit board of the present invention, at least one of the root mean square deviation Rq of contour curve at the bonded interface of the circuit layer and the root mean square deviation Sq of contour surface at the bonded interface of the circuit layer is preferably in a range of 0.20 μm or more and 0.90 μm or less.

In this case, since at least one of the root mean square deviation Rq of contour curve at the bonded interface of the circuit layer and the root mean square deviation Sq of contour surface at the bonded interface of the circuit layer is in a range of 0.20 μm or more and 0.90 μm or less, it is possible to suppress the generation of electric field concentration at the tip of the protrusion, surely ensure the insulation properties, and surely improve the adhesion between the insulating resin layer and the circuit layer.

Advantageous Effects of Invention

According to the present invention, it is possible to provide the bonded body that has exceptional adhesion between the insulating resin member and the metal part, has exceptional insulation properties in the insulating resin member, and can be stably used, and the insulating circuit board.

BRIEF DESCRIPTION OF DRAWINGS

FIG. 3(*a*) is a photograph before the surface roughening step S01 is carried out, and FIG. 3(*b*) is a photograph after the surface roughening step S01 is carried out.

DESCRIPTION OF EMBODIMENTS

Figure 1:
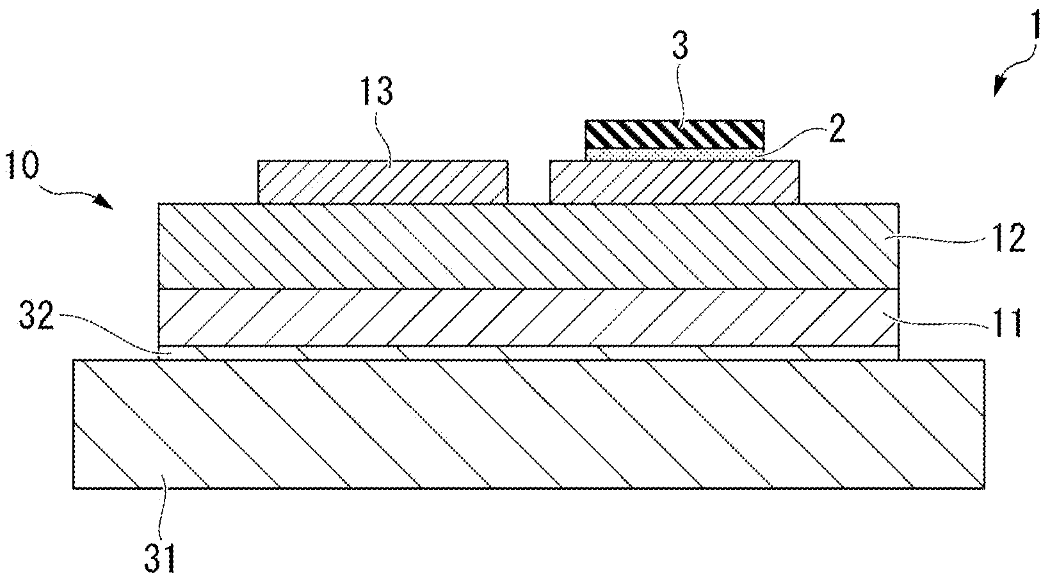
FIG. 1 is a schematic explanatory diagram of a power module provided with an insulating circuit board according to an embodiment of the present invention.

Hereinafter, embodiments of the present invention will be described with reference to the accompanying drawings.

The bonded body according to the present embodiment includes an insulating circuit board 10 configured by bonding an insulating resin layer 12 that is an insulating resin member to a metal plate 23 (circuit layer 13) that is a metal part and a metal substrate 11.

FIG. 1 shows the insulating circuit board 10 according to the embodiment of the present invention and a power module 1 using the insulating circuit board 10.

The power module 1 shown in FIG. 1 is provided with the insulating circuit board 10, a semiconductor element 3 that is bonded, through a first solder layer 2, to one surface (upper surface shown in FIG. 1) of the insulating circuit board 10, and a heat sink 31 that is bonded, through a solder layer 32, to the other side (lower side shown in FIG. 1) of the insulating circuit board 10.

The semiconductor element 3 is made of a semiconductor material such as Si. The first solder layer 2 for bonding the insulating circuit board 10 and the semiconductor element 3 is made of, for example, a Sn—Ag-based solder material, a Sn—Cu-based solder material, a Sn—In-based solder material, or a Sn—Ag—Cu-based solder material (so-called lead-free solder material).

The heat sink 31 dissipates heat on the insulating circuit board 10 side. The heat sink 31 is made of copper or a copper alloy, aluminum or an aluminum alloy, or the like, which have good thermal conductivity. In the present embodiment, the heat sink is a heat radiation plate made of oxygen-free copper. A thickness of the heat sink 31 is set in a range of 3 mm or more and 10 mm or less.

Here, the insulating circuit board 10 and the heat sink 31 are bonded through the solder layer 32. This solder layer 32 can have the same configuration as the above-mentioned solder layer 2.

As shown in FIG. 1, the insulating circuit board 10 of the present embodiment includes the metal substrate 11, the insulating resin layer 12 formed on one surface (upper surface shown in FIG. 1) of the metal substrate 11, and the circuit layer 13 formed on one surface (upper surface shown in FIG. 1) of the insulating resin layer 12.

The metal substrate 11 has an action of improving a heat dissipating feature by spreading heat generated in the semiconductor element 3 mounted on the insulating circuit board 10 in a plane direction. Therefore, the metal substrate 11 is made of a metal having excellent thermal conductivity, for example, copper or a copper alloy, or aluminum or an aluminum alloy. In the present embodiment, the metal substrate 11 is made of a rolled plate composed of oxygen-free copper. A thickness of the metal substrate 11 is set in a range of 0.05 mm or more and 3 mm or less and is set to 2.0 mm in the present embodiment.

The insulating resin layer 12 prevents electrical connection between the circuit layer 13 and the metal substrate 11 and is made of a thermosetting resin with insulation properties.

In the present embodiment, a thermosetting resin containing a filler is used to ensure the strength of the insulating resin layer 12 and to ensure the thermal conductivity. Here, as the filler, for example, alumina, boron nitride, aluminum nitride, or the like can be used. In addition, as the thermosetting resin, an epoxy resin, a polyimide resin, or the like can be used. In the present embodiment, the insulating resin layer 12 is made of an epoxy resin containing alumina as a filler. A thickness of the insulating resin layer 12 is in a range of 20 μm or more and 250 μm or less and is 150 μm in the present embodiment.

Figure 4:
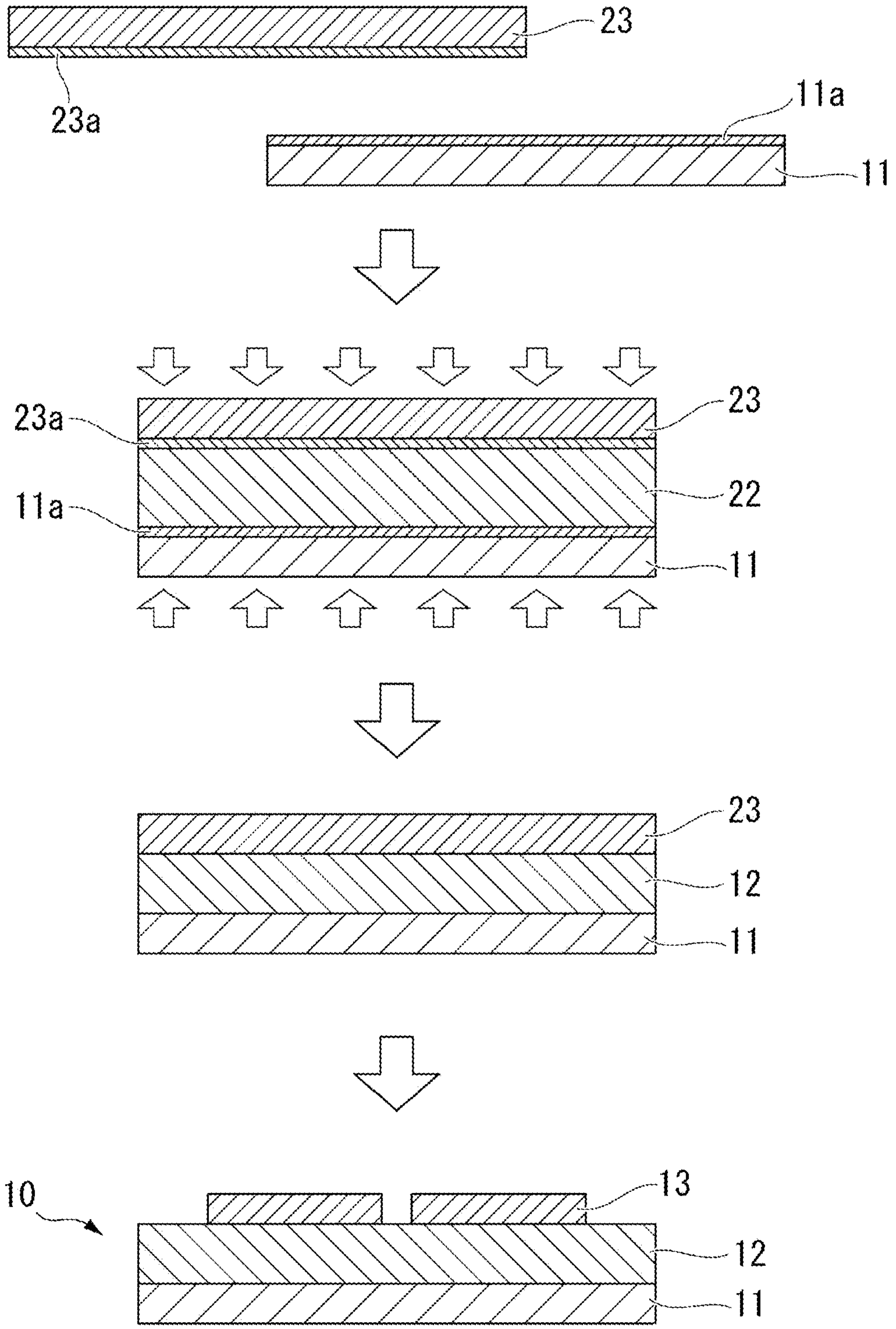
FIG. 4 is a schematic explanatory diagram of the method for manufacturing an insulating circuit board shown in FIG. 2.

As shown in FIG. 4, the circuit layer 13 is formed such that the metal plate 23 made of a metal having excellent conductivity is bonded to one surface (upper surface shown in FIG. 4) of the insulating resin layer 12. As the metal plate 23, a rolled plate made of a material such as copper or a copper alloy, aluminum or an aluminum alloy can be used. In the present embodiment, a rolled plate made of oxygen-free copper is used as the metal plate 23 constituting the circuit layer 13.

In the circuit layer 13, a circuit pattern is formed, and one surface (upper surface shown in FIG. 1) thereof is a mounting surface on which the semiconductor element 3 is mounted. Here, a thickness of the circuit layer 13 (metal plate 23) is set in a range of 0.3 mm or more and 3 mm or less and is set to 0.5 mm in the present embodiment.

In the insulating circuit board 10 of the present embodiment, a bonded interface between the insulating resin layer 12 and the circuit layer 13 (metal substrate 11) has an uneven shape including a protrusion 18 in which the circuit layer 13 (metal substrate 11) protrudes toward the insulating resin layer 12 side and a recess 19 in which the circuit layer 13 (metal substrate 11) retracts from the insulating resin layer 12 side.

That is, in the present embodiment, the circuit layer 13 (metal substrate 11) intrudes into the insulating resin layer 12.

Here, in the present embodiment, at least one of a kurtosis Rku of contour curve at the bonded interface of the circuit layer 13 (metal substrate 11) and a kurtosis Sku of contour surface at the bonded interface of the circuit layer 13 (metal substrate 11) is in a range of 2.75 or more and 6.00 or less.

In addition, an overhang rate that indicates a length ratio of regions overlapping in a lamination direction in a direction along the bonded interface is 7% or more. In the present embodiment, at least one of the root mean square deviation Rq of contour curve at the bonded interface of the circuit layer 13 (metal substrate 11) and the root mean square deviation Sq of contour surface at the bonded interface of the circuit layer 13 (metal substrate 11) is preferably in a range of 0.20 μm or more and 0.90 μm or less.

Hereinafter, regarding the insulating circuit board 10 of the present embodiment, the reason why the kurtosis of assessed profile Rku at the bonded interface of the circuit layer 13 (metal substrate 11), the kurtosis of scale-limited surface Sku at the bonded interface of the circuit layer 13 (metal substrate 11), the overhang rate that indicates a length ratio of regions overlapping in the lamination direction in the direction along the bonded interface, the root mean square deviation of assessed profile Rq at the bonded interface of the circuit layer 13 (metal substrate 11), and the root mean square deviation of scale-limited surface Sq at the bonded interface of the circuit layer 13 (metal substrate 11) are defined as mentioned above will be described.

(Kurtosis of Assessed Profile Rku and Kurtosis of Scale-Limited Surface Sku at Bonded Interface)

The kurtosis of assessed profile Rku is a parameter defined in JIS B 0601:2001, the kurtosis of scale-limited surface Sku is a parameter defined in JIS B 0681-2:2018, and each of the parameters is obtained by evaluating kurtosis that is a measure of surface sharpness.

The kurtosis of assessed profile Rku is Rku=3 in the shape of the normal distribution, Rku>3 in a case where the height distribution is sharper than the normal distribution, and Rku<3 in a case where the height distribution is crushed as compared with the normal distribution.

In addition, the Kurtosis of scale-limited surface Sku is a parameter in which the kurtosis of assessed profile Rku extends to three dimensions.

Here, in a case where both the kurtosis of assessed profile Rku and the kurtosis of scale-limited surface Sku at the bonded interface of the circuit layer 13 (metal substrate 11) are less than 2.75, the surface of the circuit layer 13 (the tip of the protrusion 18) is shaped in a crushed state, so that the circuit layer 13 (metal substrate 11) may not sufficiently intrude into the insulating resin layer 12 side, and the adhesion between the insulating resin layer 12 and the circuit layer 13 (metal substrate 11) may not be improved. On the other hand, in a case where both the kurtosis of assessed profile Rku and the kurtosis of scale-limited surface Sku at the bonded interface of the circuit layer 13 (metal substrate 11) are more than 6.00, the surface of the circuit layer 13 (the tip of the protrusion 18) is sharper than necessary, so that electric field concentration is generated at the tip of the protrusion 18, and insulation properties (insulating withstand voltage) of the insulating resin layer 12 may not be ensured.

Therefore, in the present embodiment, at least one of the kurtosis Rku of contour curve at the bonded interface of the circuit layer 13 (metal substrate 11) and a kurtosis Sku of contour surface at the bonded interface of the circuit layer 13 (metal substrate 11) is set to be in the range of 2.75 or more and 6.00 or less.

At least one of the kurtosis Rku of contour curve at the bonded interface of the circuit layer 13 (metal substrate 11) and the kurtosis Sku of contour surface at the bonded interface of the circuit layer 13 (metal substrate 11) is preferably 2.75 or more, and still more preferably 3.00 or more. On the other hand, at least one of the kurtosis Rku of contour curve at the bonded interface of the circuit layer 13 (metal substrate 11) and the kurtosis Sku of contour surface at the bonded interface of the circuit layer 13 (metal substrate 11) is preferably 6.00 or less, and still more preferably 3.75 or less.

(Overhang Rate)

The overhang rate in the present embodiment is obtained in such a manner that the cross-sectional shape of the bonded interface is image-analyzed with image processing software, regions overlapping in a lamination direction (height direction: Y direction) in a direction along the bonded interface (horizontal direction: X direction) with respect to the obtained cross-sectional curve are defined as overhang portions, which is defined as a ratio of lengths of the overhang portions in the X direction to all of the length of the obtained cross-sectional curve in the X direction.

In a case of counting the lengths of the overhang portions in the X direction, for example, it is counted as 0 in a case where there is no overhang portion in the Y direction, it is counted as 1 in a case where there is one overhang portion in the Y direction, and it is counted as 2 in a case where there are two overhang portions in the Y direction, and it is counted as the plural number in a case where there are a plurality of the overhang portions. Therefore, the overhang rate may be 100% or more.

Here, in a case where the overhang rate that indicates the length ratio of regions overlapping in the lamination direction in the direction along the bonded interface is less than 7%, the circuit layer 13 (metal substrate 11) and the insulating resin layer 12 are not sufficiently engaged, and the adhesion between the insulating resin layer 12 and the circuit layer 13 (metal substrate 11) may not be improved.

Therefore, in the present embodiment, the overhang rate that indicates the length ratio of regions overlapping in the lamination direction in the direction along the bonded interface is defined as 7% or more.

The above-mentioned overhang rate is preferably 7% or more, and still more preferably 15% or more. On the other hand, the overhang rate is not particularly limited, but is preferably 100% or less.

(Root Mean Square Deviation of Assessed Profile Rq and Root Mean Square Deviation of Scale-Limited Surface Sq at Bonded Interface)

The root mean square deviation of assessed profile Rq is a parameter specified in JIS B 0601:2001, and the root mean square deviation of scale-limited surface Sq is a parameter specified in JIS B 0681-2:2018, each of which means the standard deviation of the surface roughness.

In the insulating circuit board 10 of the present embodiment, the circuit layer 13 (metal substrate 11) sufficiently intrudes into the insulating resin layer 12 side by setting at least one of the root mean square deviation Rq of contour curve at the bonded interface of the circuit layer 13 (metal substrate 11) and the root mean square deviation Sq of contour surface at the bonded interface of the circuit layer 13 (metal substrate 11) to 0.20 μm or more, so that the adhesion between the insulating resin layer 12 and the circuit layer 13 (metal substrate 11) can be surely improved. On the other hand, the generation of electric field concentration at the tip of the protrusion 18, which is formed by the circuit layer 13 (metal substrate 11) intruding inside the insulating resin layer 12, can be suppressed by setting at least one of the root mean square deviation Rq of contour curve at the bonded interface of the circuit layer 13 (metal substrate 11) and the root mean square deviation Sq of contour surface at the bonded interface of the circuit layer 13 (metal substrate 11) to 0.90 μm or less, so that the insulation properties of the insulating resin layer 12 can be surely ensured.

Therefore, in the insulating circuit board 10 of the present embodiment, at least one of the root mean square deviation Rq of contour curve at the bonded interface of the circuit layer 13 (metal substrate 11) and the root mean square deviation Sq of contour surface at the bonded interface of the circuit layer 13 (metal substrate 11) is preferably in the range of 0.20 μm or more and 0.90 μm or less.

At least one of the root mean square deviation Rq of contour curve at the bonded interface of the circuit layer 13 (metal substrate 11) and the root mean square deviation Sq of contour surface at the bonded interface of the circuit layer 13 (metal substrate 11) is preferably 0.20 μm or more, and still more preferably 0.30 μm or more. By contrast, at least one of the root mean square deviation Rq of contour curve at the bonded interface of the circuit layer 13 (metal substrate 11) and the root mean square deviation Sq of contour surface at the bonded interface of the circuit layer 13 (metal substrate 11) is preferably 0.90 μm or less, and still more preferably 0.80 μm or less.

Next, a method for manufacturing the insulating circuit board 10 according to the present embodiment will be described with reference to FIGS. 2 to 4.

(Surface Roughening Step S01)

First, a roughened plating layer **23*a* is formed on a bonding surface between the metal plate 23 serving as the circuit layer 13 and the insulating resin layer 12, and a roughened plating layer 11*a* is formed on a bonding surface between the metal substrate 11 and the insulating resin layer 12. As a result, uneven portions are formed on the bonding surface between the metal plate 23 serving as the circuit layer 13 and the insulating resin layer 12 and the bonding surface between the metal substrate 11 and the insulating resin layer 12. The roughened plating layers 23*a* and 11*a*** are formed as follows.

Electrolytic plating treatment is carried out on the bonding surfaces between the metal plate 23 and the metal substrate 11. In the present embodiment, it is preferable to use an electrolytic solution consisting of an aqueous solution that is obtained by adding 3,3'-dithiobis(1-propane sulfonic acid)2 sodium into a copper sulfate bath containing copper sulfate ($CuSO_4$) and sulfuric acid ($H_2SO_4$) as main components, as an electrolytic plating solution. A temperature of the plating bath is preferably in a range of, for example, 25° C. or higher and 35° C. or lower.

As the electrolytic plating treatment, a periodic reverse (PR) pulse plating treatment is used. This PR pulse plating treatment is a method of performing electrolytic plating by energization while periodically reversing a direction of electric current. For example, positive electrolysis (anodic electrolysis in which the metal plate 23 and the metal substrate 11 serve as an anode) of 1 $A/dm^2$ or more and 30 $A/dm^2$ or less is set to 1 ms or more and 1000 ms or less, and negative electrolysis (cathode electrolysis in which the metal plate 23 and the metal substrate 11 serve as a cathode) of 1 $A/dm^2$ or more and 30 $A/dm^2$ or less is set to 1 ms or more and 1000 ms or less, which is repeated.

As a result, the melting of the surfaces of the metal plate 23 and the metal substrate 11 and the precipitation of copper are repeatedly carried out, thereby forming the roughened plating layers 23*a* and 11*a*.

Here, it is possible to adjust the kurtosis of assessed profile Rku, the kurtosis of scale-limited surface Sku, the overhang rate, the root mean square deviation of assessed profile Rq, and the root mean square deviation of scale-limited surface Sq at the bonding surface between the metal plate 23 and the metal substrate 11 based on surface properties of the metal plate 23 and the metal substrate 11 before forming the roughened plating layers 23*a* and 11*a*, and various plating conditions (pulse application time, pulse waveform (ratio of precipitation amount/melting amount), and pulse frequency).

For example, in a case where the pulse application time is lengthened, the kurtosis of assessed profile Rku and the kurtosis of scale-limited surface Sku each are close to 3, the overhang rate increases, and the root mean square deviation of assessed profile Rq and the root mean square deviation of scale-limited surface Sq increase.

In addition, in a case where, as a pulse waveform, the ratio of precipitation amount/melting amount is increased, the kurtosis of assessed profile Rku and the kurtosis of scale-limited surface Sku each increase, the overhang rate decreases, and the root mean square deviation of assessed profile Rq and the root mean square deviation of scale-limited surface Sq decrease.

Furthermore, in a case where the pulse frequency is increased, the kurtosis of assessed profile Rku and the kurtosis of scale-limited surface Sku each are close to 3, the overhang rate decreases, and the root mean square deviation of assessed profile Rq and the root mean square deviation of scale-limited surface Sq decrease.

Figure 3:
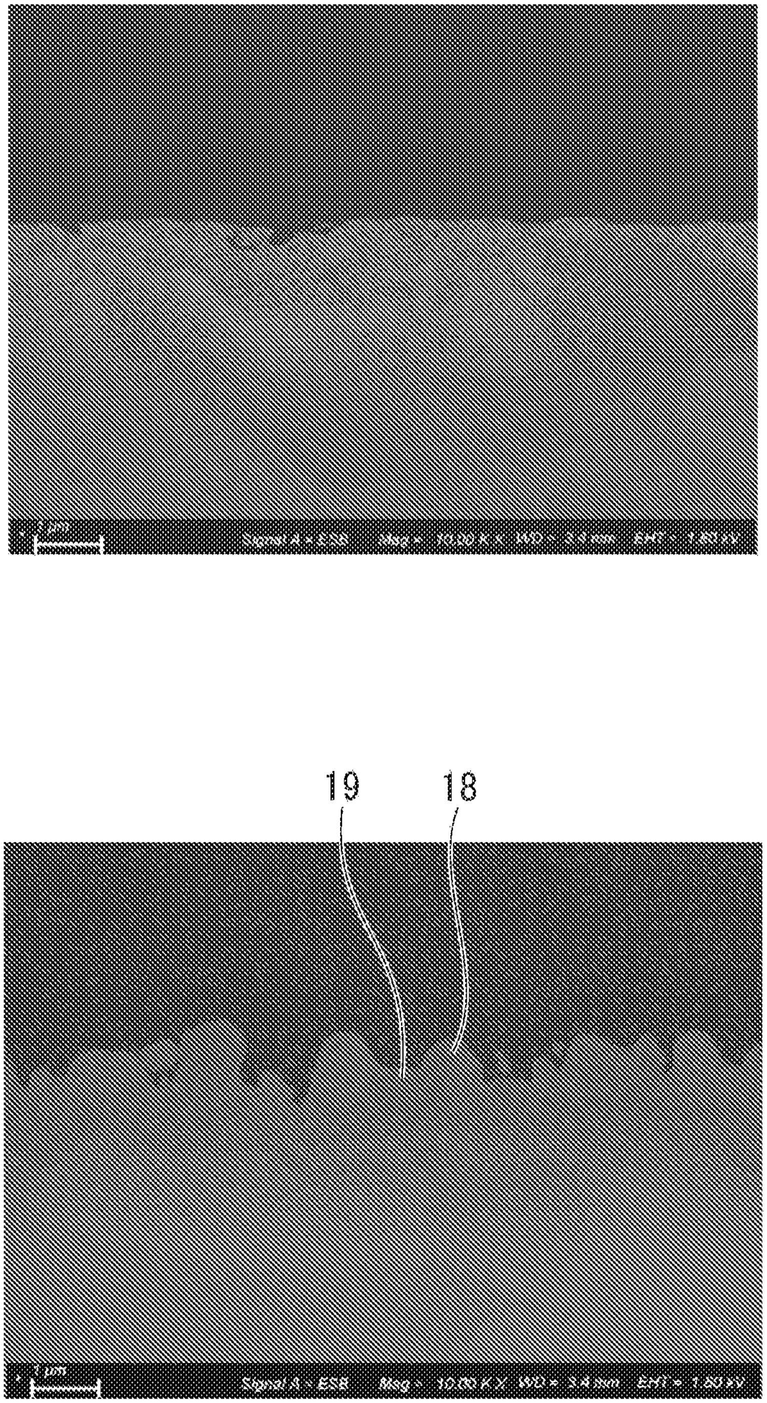
FIG. 3 shows cross-sectional observation photographs of a metal plate (metal substrate) before and after a surface roughening step S01 in the method for manufacturing an insulating circuit board according to the embodiment of the present invention.

Here, FIG. 3(*a*) shows a cross-sectional photograph of the metal plate 23 (metal substrate 11) before the surface roughening step S01 is carried out, and FIG. 3(*b*) shows a cross-sectional photograph of the metal plate 23 (metal substrate 11) after the surface roughening step S01 is carried out.

It is confirmed that the uneven portion is formed on the bonding surface of the metal plate 23 (metal substrate 11) by carrying out the surface roughening step S01 of the present embodiment, and the overhang portion is formed.

(Laminating Step S02)

Next, a resin composition 22 containing alumina as a filler, an epoxy resin as a thermosetting resin, and a curing agent is arranged on one surface (upper surface shown in FIG. 4) of the metal substrate 11. In the present embodiment, the resin composition 22 is formed in a sheet shape.

The metal plate 23 serving as the circuit layer 13 is arranged on one surface (upper surface shown in FIG. 4) of the resin composition 22.

(Thermocompression Bonding Step S03)

Next, the metal substrate 11, the resin composition 22, and the metal plate 23, which have been laminated, are pressurized and heated in a lamination direction, the resin composition 22 is cured to form the insulating resin layer 12, thereby bonding the metal substrate 11 and the insulating resin layer 12 to each other and bonding the insulating resin layer 12 and the metal plate 23 to each other.

In this thermocompression bonding step S03, conditions in which a heating temperature is within a range of 150° C. or higher and 400° C. or lower, a holding time at the heating temperature is within a range of 30 minutes or longer and 90 minutes or shorter, and a pressurizing pressure in the lamination direction is in a range of 1 MPa or more and 100 MPa or less are preferably employed.

(Circuit Pattern Forming Step S04)

Next, the metal plate 23 bonded to the insulating resin layer 12 is subjected to etching treatment to form a circuit pattern, thereby forming the circuit layer 13.

As described above, the insulating circuit board 10 according to the present embodiment is manufactured.

(Heat Sink Bonding Step S05)

Next, the heat sink 31 is bonded to the other surface of the metal substrate 11 of the insulating circuit board 10. In the present embodiment, the metal substrate 11 and the heat sink 31 are bonded through a solder material.

(Semiconductor Element—Bonding Step S06)

The semiconductor element 3 is bonded to the circuit layer 13 of the insulating circuit board 10. In the present embodiment, the circuit layer 13 and the semiconductor element 3 are bonded through a solder material.

The power module 1 shown in FIG. 1 is manufactured by the above-mentioned steps.

According to the insulating circuit board 10 (bonded body) of the present embodiment, since the bonded interface between the insulating resin layer 12 and the circuit layer 13 (metal substrate 11) has an uneven shape including the protrusion 18 in which the circuit layer 13 (metal substrate 11) protrudes toward the insulating resin layer 12 side and the recess 19 in which the circuit layer 13 (metal substrate 11) retracts from the insulating resin layer 12 side, and at least one of the kurtosis Rku of contour curve at the bonded interface of the circuit layer 13 (metal substrate 11) and the kurtosis Sku of contour surface at the bonded interface of the circuit layer 13 (metal substrate 11) is set to 2.75 or more, the circuit layer 13 (metal substrate 11) sufficiently intrudes into the insulating resin layer 12 side, so that the adhesion between the insulating resin layer 12 and the circuit layer 13 (metal substrate 11) can be improved. In addition, since at least one of the kurtosis Rku of contour curve at the bonded interface of the circuit layer 13 (metal substrate 11) and the kurtosis Sku of contour surface at the bonded interface of the circuit layer 13 (metal substrate 11) is set to 6.00 or less, the tip of the protrusion 18 is not sharpened more than necessary, and the insulation properties (insulating withstand voltage) of the insulating resin portion layer can be sufficiently ensured.

Furthermore, since the overhang rate indicating the length ratio of regions overlapping in the lamination direction in the direction along the bonded interface is 7% or more, the circuit layer 13 (metal substrate 11) and the insulating resin layer 12 are sufficiently engaged, and the adhesion between the circuit layer 13 (metal substrate 11) and the insulating resin layer 12 can be improved.

Here, in the insulating circuit board 10 (bonded body) of the present embodiment, in a case where at least one of the root mean square deviation Rq of contour curve at the bonded interface of the circuit layer 13 (metal substrate 11) and the root mean square deviation Sq of contour surface at the bonded interface of the circuit layer 13 (metal substrate 11) is in the range of 0.20 μm or more and 0.90 μm or less, it is possible to suppress the generation of electric field concentration at the tip of the protrusion 18, surely ensure the insulation properties in the insulating resin layer 12, and surely improve the adhesion between the circuit layer 13 (metal substrate 11) and the insulating resin layer 12.

Although the embodiments of the present invention are described above, the present invention is not limited thereto and can be appropriately modified without departing from the technical idea of the invention.

Figure 2:
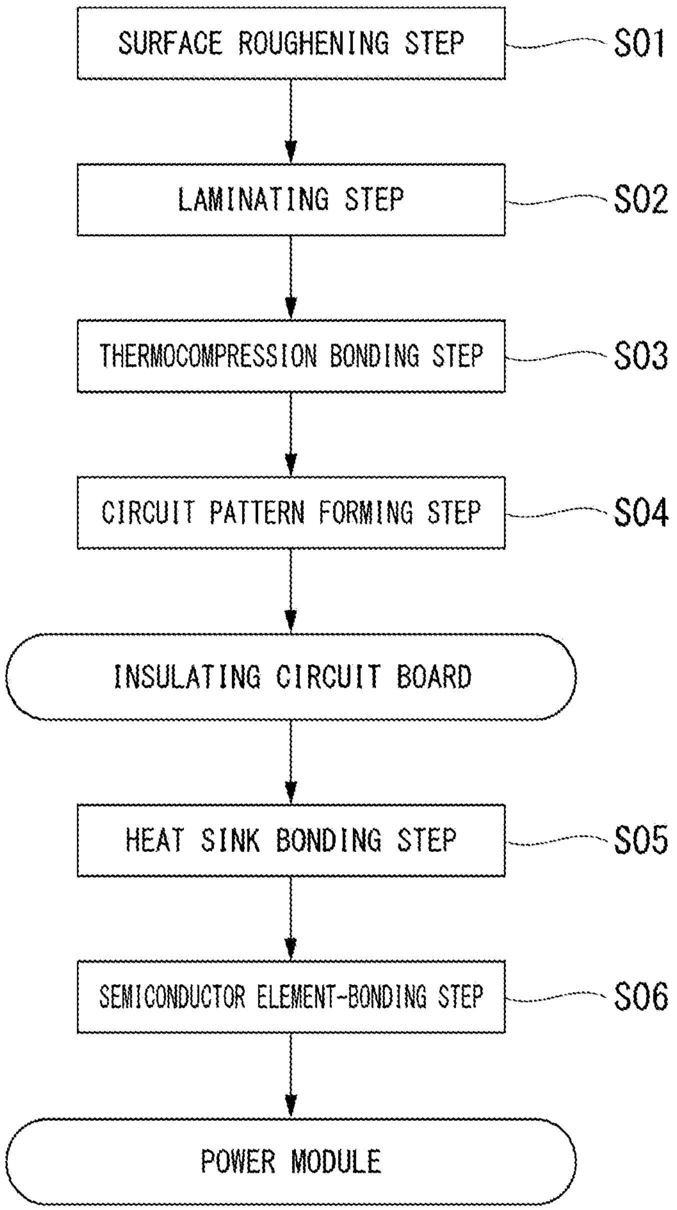
FIG. 2 is a flow chart showing a method for manufacturing an insulating circuit board according to an embodiment of the present invention.

In the present embodiment, the insulating circuit board is manufactured by the method for manufacturing the insulating circuit board shown in FIGS. 2 to 4, but the present invention is not limited thereto.

In the present embodiment, the metal plate for forming the metal substrate and the circuit layer is described as being composed of oxygen-free copper, but the metal plate is not limited thereto, and may be made of another metal composed of copper or a copper alloy or may be made of another metal such as aluminum or an aluminum alloy. Furthermore, a structure in which a plurality of metals are laminated may be adopted.

Furthermore, in the present embodiment, the configuration of the power module in which the semiconductor element is mounted on the insulating circuit board is described, but the present invention is not limited thereto. For example, a configuration of an LED module in which a LED element is mounted on the circuit layer of the insulating circuit board may be adopted, or a configuration of a thermoelectric module in which a thermoelectric element is mounted on the circuit layer of the insulating circuit board may be adopted.

EXAMPLES

The results of a confirmation experiment conducted to confirm the effect of the present invention will be described below.

A metal substrate (40 mm×40 mm×thickness of 2 mm) formed of a rolled plate made of oxygen-free copper and a metal plate serving as the circuit layer (40 mm×40 mm×thickness of 0.5 mm) were prepared, and a roughened plating layer was formed on a bonding surface between these metal substrate and insulating resin layer of the metal plate by the PR pulse electrolysis method described in the above-mentioned embodiment.

Then, a sheet material (40 mm×40 mm×thickness of 0.15 mm) composed of a resin composition containing an epoxy resin containing $Al_2O_3$ as a filler was disposed on a surface on which the roughened plating layer of the metal substrate was formed.

In addition, the metal plate serving as the circuit layer was laminated on one surface of the sheet material composed of this resin composition so that the surface on which the roughened plating layer was formed faced the sheet material side of the resin composition.

The metal substrate laminated as described above, the sheet material composed of the resin composition, and the metal plate were heated while being pressurized in the lamination direction, the resin composition was cured to form an insulating resin layer, and the metal substrate and the insulating resin layer were bonded to each other, and the insulating resin layer and the metal plate were bonded to each other, thereby obtaining an insulating circuit board. A pressurizing pressure in the lamination direction was 10 MPa, a heating temperature was 180° C., and a holding time at the heating temperature was 60 minutes.

The following items were evaluated for the obtained insulating circuit board as described above.

(Kurtosis and Root Mean Square Deviation)

The bonded interface between the circuit layer and the insulating resin layer was observed by using a laser microscope OLS5000 with an objective lens with a magnification of 100 times in a measurement range of 129 μm×129 μm, the sample tilt and noise were removed, and a kurtosis of scale-limited surface Sku at the bonded interface and a root mean square deviation of scale-limited surface Sq at the bonded interface were calculated.

Next, a kurtosis of assessed profile Rku at the bonded interface and a root mean square deviation of scale-limited surface Rq at the bonded interface were calculated in the direction in which the roughness was considered to be the coarsest. At least three or more points were measured in the measurement range, and an average value thereof was described in Table.

(Overhang Rate)

The insulating circuit board was cut along the diagonal direction and along the lamination direction, and the cross-section of the bonded interface between the circuit layer and the insulating resin layer was observed to obtain a SIM image (512 pixels=11 μm) at a magnification of 10,000 times. This SIM image was binarized by using image analysis software ImageJ, noise was manually removed, and an outline was then extracted.

The outline-extracted cross-sectional curvilinear coordinates were output in csv, and the number of overlapping metal regions in the Y direction was counted for a length of 512 pixels in the X direction. In addition, pixels extending in the Y direction (pixels adjacent to the Y direction) were excluded so that the vertical lines would not be counted in duplicate. Then, the number of overlapping regions on each position of an X-axis was divided by the total X-coordinate length to obtain an overhang rate.

$$[\text{Overhang rate}]=[\text{Total number of overhang regions for each position of } X\text{-axis}]/[\text{Number of pixels in } X \text{ direction}]\times 100(\%)$$

Figure 5:
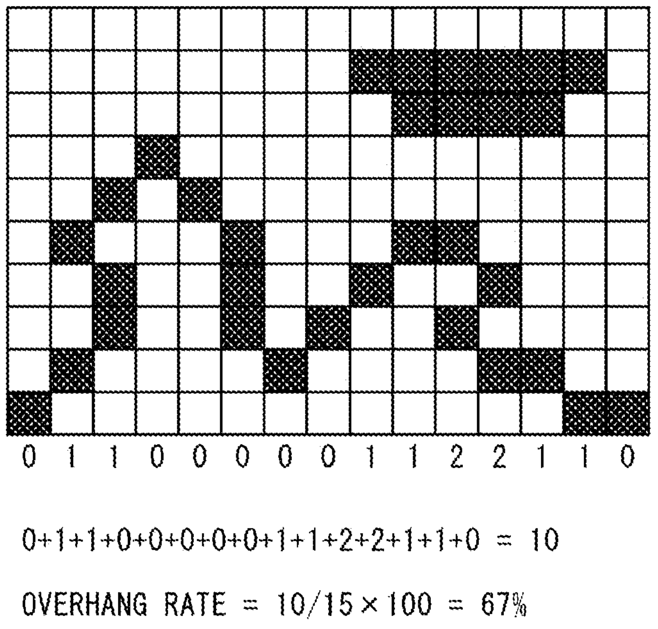
FIG. 5 is an explanatory diagram showing a measurement example of an overhang rate in Example.

A measurement example is shown in FIG. 5. In the cross-sectional curve shown in FIG. 5, the number of overlapping regions in the Y direction for each position of the X-axis is 0, 1, 1, 0, 0, 0, 0, 0, 1, 1, 2, 2, 1, 1, 0, in order from the left, the total of these is 10, and the number of pixels in the X direction is 15. As a result, the overhang rate is 10/15×100, which is 67%.

(Reflow Treatment after Moisture Absorption Treatment)

The above-mentioned insulating circuit board was placed in a constant temperature and humidity chamber (temperature of 85° C., humidity of 85%) and held for 3 days. Thereafter, the insulating circuit board was charged into a heating furnace and reflowed at 290° C. for 10 minutes.

In the insulating circuit board after carrying out the reflow treatment, a bonding rate between the circuit layer and the insulating resin layer and a dielectric breakdown voltage were evaluated as follows.

(Bonding Rate)

The bonding rate between the circuit layer and the insulating resin layer was evaluated by using an ultrasonic flaw detector (FineSAT200 manufactured by Hitachi Power Solutions Co., Ltd.) and calculated from the following Equation. Here, an initial bonding area is an area to be bonded before bonding. Since the peeling is shown by the white part in the bonding part in the image obtained by binarizing ultrasonic-detected image, the area of this white part is defined as an exfoliation area.

$$(\text{Bonding rate})=\{(\text{Initial bonding area})-(\text{Exfoliation area})\}/(\text{Initial bonding area})\times 100$$

(Dielectric Breakdown Voltage)

Figure 6:
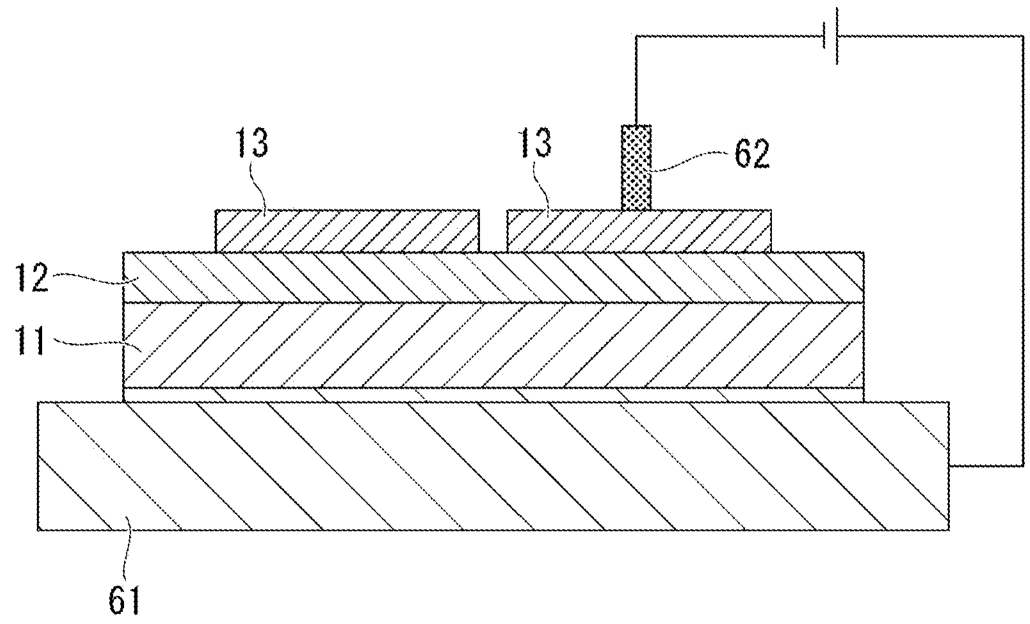
FIG. 6 is a schematic explanatory diagram of a test device for evaluating insulation properties (insulating withstand voltage) of the insulating circuit board in Example.

As shown in FIG. 6, the metal substrate 11 was placed on a base plate 61, a probe 62 was brought into contact with the circuit layer 13, and the partial discharge was evaluated. A partial discharge tester manufactured by MITSUBISHI CABLE INDUSTRIES, LTD. was used as a measuring device. A test atmosphere was Fluorinert™ FC-770 manufactured by 3M.

Then, a voltage was boosted by a step profile (holding time for 30 seconds) every 0.5 kV, and a voltage at which the dielectric breakdown occurred (the voltage at which the leakage current was 10 mA or higher) was defined as the dielectric breakdown voltage.

The evaluation results are shown in Table 1.

TABLE 1

| | | Bonded interface | | | | | Evaluation | |
|---|---|---|---|---|---|---|---|---|
| | | Kurtosis | | Overhang rate | Root mean square deviation (μm) | | Bonding rate | Dielectric breakdown voltage |
| | | Rku | Sku | (%) | Rq | Sq | (%) | (V) |
| Examples of the present embodiment | 1 | 3.10 | 3.40 | 20.7 | 0.44 | 0.44 | 98 | 7.6 |
| | 2 | 3.50 | 3.50 | 16.7 | 0.37 | 0.35 | 97 | 7.0 |
| | 3 | 5.20 | 5.90 | 7.3 | 0.31 | 0.28 | 95 | 6.6 |
| | 4 | 3.10 | 2.80 | 10.5 | 0.38 | 0.43 | 88 | 7.7 |
| | 5 | 5.80 | 5.50 | 7.1 | 0.67 | 0.77 | 86 | 6.0 |
| | 6 | 3.60 | 3.30 | 7.3 | 0.20 | 0.23 | 85 | 7.4 |
| | 7 | 3.30 | 3.40 | 16.2 | 0.20 | 0.10 | 84 | 7.8 |
| | 8 | 4.50 | 5.00 | 13.3 | 0.88 | 0.90 | 98 | 5.8 |
| Comparative example | 1 | 2.70 | 2.50 | 18.4 | 0.67 | 0.69 | 80 | 7.5 |
| | 2 | 10.30 | 9.40 | 13.6 | 0.20 | 0.24 | 91 | 5.1 |
| | 3 | 3.40 | 3.20 | 4.2 | 0.30 | 0.26 | 82 | 7.8 |

In Comparative Example 1 in which the kurtosis of assessed profile Rku at the bonded interface of the circuit layer was 2.70 and the kurtosis of scale-limited surface Sku at the bonded interface of the circuit layer was 2.50, the bonding rate after the moisture absorption reflow was as low as 80%, and the adhesion between the circuit layer and the insulating resin layer was insufficient.

In Comparative Example 2 in which the kurtosis of assessed profile Rku at the bonded interface of the circuit layer was 10.30 and the kurtosis of scale-limited surface Sku at the bonded interface of the circuit layer was 9.40, the dielectric breakdown voltage after the moisture absorption reflow was as low as 5.1 V, and the insulation properties was insufficient.

In Comparative Example 3 in which the overhang rate was 4.2%, the bonding rate after the moisture absorption reflow was as low as 82%, and the adhesion between the circuit layer and the insulating resin layer was insufficient.

On the other hand, in Examples 1 to 8 of the present invention, in which at least one of the kurtosis Rku of contour curve at the bonded interface of the circuit layer and the kurtosis Sku of contour surface at the bonded interface of the circuit layer was in the range of 2.75 or more and 6.00 or less, and the overhang rate is 7% or more, the bonding rate after the moisture absorption reflow was 84% or more, and the adhesion between the circuit layer and the insulating resin layer was excellent. In addition, the dielectric breakdown voltage after the moisture absorption reflow was 5.8 V or more, and the insulating resin layer was excellent in insulation properties. In each of Examples 1 to 8 of the present invention, at least one of the root mean square deviation Rq of contour curve at the bonded interface of the circuit layer and the root mean square deviation Sq of contour surface at the bonded interface of the circuit layer was in the range of 0.20 μm or more and 0.90 μm or less. In addition, in each of Examples 1 to 8 of the present invention, since both the kurtosis of assessed profile Rku at the bonded interface of the circuit layer and the kurtosis of scale-limited surface Sku at the bonded interface of the circuit layer were thin the range of 2.75 or more and 6.00 or less, the adhesion between the circuit layer and the insulating resin layer was particularly excellent.

Furthermore, in each of Examples 1 to 6, and 8 of the present invention, in which both the root mean square deviation of assessed profile Rq at the bonded interface of the circuit layer and the root mean square deviation of scale-limited surface Sq at the bonded interface of the circuit layer were in the range of 0.20 μm or more and 0.90 μm or less, the bonding rate after the moisture absorption reflow was 85% or more, and the adhesion between the circuit layer and the insulating resin layer was particularly excellent.

According to the examples of the present invention, from the above experimental results, it was confirmed that it was possible to provide the insulating circuit board (bonded body), in which the adhesion between the insulating resin layer (insulating resin member), the circuit layer (metal part) was excellent and the insulation properties in the insulating resin layer (insulating resin member) was excellent, and the insulating circuit board can be used stably.

REFERENCE SIGNS LIST

10: Insulating circuit board (bonded body)
11: Metal substrate (metal part)
12: Insulating resin layer (insulating resin member)
13: Circuit layer (metal part)
18: Protrusion
19: Recess

What is claimed is:

1. A metal plate for bonding with an insulating resin member, wherein one surface of the metal plate has an uneven shape including a protrusion in which the metal plate protrudes outward and a recess in which the metal plate is concave inward, at least one of a kurtosis Rku of contour curve at the one surface of the metal plate and a kurtosis Sku of contour surface at the one surface of the metal plate is in a range of 2.75 or more and 6.00 or less, and an overhang rate that indicates a length ratio of regions overlapping in a lamination direction in a direction along the one surface is 7% or more.

2. The metal plate according to claim 1, wherein at least one of a root mean square deviation Rq of contour curve at the one surface of the metal plate and a root mean square deviation Sq of contour surface at the one surface of the metal plate is in a range of 0.20 μm or more and 0.90 μm or less.

3. The metal plate according to claim 1, being a circuit layer on which a circuit pattern is formed.

* * * * *